(12) United States Patent
Kim et al.

(10) Patent No.: US 10,950,675 B2
(45) Date of Patent: Mar. 16, 2021

(54) SIGNAL CONTROL UNIT FOR AN ORGANIC LIGHT EMITTING DIODE DISPLAY DEVICE, METHOD OF MANUFACTURING THE SAME, AND ORGANIC LIGHT EMITTING DIODE DISPLAY DEVICE INCLUDING THE SAME

(71) Applicant: DB HITEK CO., LTD., Seoul (KR)

(72) Inventors: Dae Il Kim, Cheongju-si (KR); Seung Ha Lee, Hwaseong-si (KR); Jung Hyun Lee, Yeoju-si (KR); Jin Hyo Jung, Suwon-si (KR); Young Jin Kim, Pohang-si (KR); Dong Hoon Park, Uiwang-si (KR)

(73) Assignee: DB HITEK CO., LTD., Seoul (KR)

( * ) Notice: Subject to any disclaimer, the term of this patent is extended or adjusted under 35 U.S.C. 154(b) by 37 days.

(21) Appl. No.: 16/385,485

(22) Filed: Apr. 16, 2019

(65) Prior Publication Data
US 2019/0319081 A1 Oct. 17, 2019

(30) Foreign Application Priority Data
Apr. 17, 2018 (KR) .......................... 10-2018-0044552

(51) Int. Cl.
*H01L 21/00* (2006.01)
*H01L 27/32* (2006.01)
(Continued)

(52) U.S. Cl.
CPC ........ *H01L 27/3253* (2013.01); *H01L 27/322* (2013.01); *H01L 51/5253* (2013.01); *H01L 51/56* (2013.01)

(58) Field of Classification Search
CPC .... H01L 27/3253; H01L 51/56; H01L 27/322
See application file for complete search history.

(56) References Cited

U.S. PATENT DOCUMENTS 9,570,533 B2 * 2/2017 Zhang ................. H01L 27/3279
9,905,797 B2 * 2/2018 Zhang ................. H01L 27/3279
(Continued)

FOREIGN PATENT DOCUMENTS

KR 20190121056 A * 10/2019 ........... H01L 27/124
WO WO-2015058571 A1 * 4/2015 ......... H01L 51/5253

*Primary Examiner* — Laura M Menz
(74) *Attorney, Agent, or Firm* — Patterson Thuente Pedersen, P.A.

(57) ABSTRACT

A signal control unit for an organic light emitting diode (OLED) display device, includes a substrate structure including a plurality of active elements each corresponding to a pixel, a lower metal pattern disposed on the substrate structure, and electrically connected to a portion of the plurality of active elements, an insulating interlayer disposed on the substrate structure and at least partially covering the lower metal pattern, a via contact penetrating through the insulating interlayer and connected to the lower metal pattern, a metal electrode disposed on the insulating interlayer, and connected to the via contact, and an electrode passivation layer pattern substantially covering the metal electrode to expose a center portion of an upper surface of the metal electrode while covering a remainder of the upper surface and a side surface of the metal electrode. Therefore, leakage current which flows through the side surface of the metal electrode is suppressed.

15 Claims, 5 Drawing Sheets

(51) Int. Cl.
    *H01L 51/56*         (2006.01)
    *H01L 51/52*         (2006.01)

(56) References Cited

U.S. PATENT DOCUMENTS

| | | | |
|---|---|---|---|
| 10,199,593 B2* | 2/2019 | Byun | H01L 51/502 |
| 10,497,759 B2* | 12/2019 | Song | H01L 27/322 |
| 10,510,970 B2* | 12/2019 | Lu | H01L 51/5228 |
| 10,658,449 B2* | 5/2020 | Wang | H01L 51/5228 |
| 2007/0042518 A1* | 2/2007 | Chen | H01L 27/3262 |
| | | | 438/29 |
| 2016/0043343 A1* | 2/2016 | Zhang | H01L 51/5253 |
| | | | 257/40 |
| 2016/0307986 A1* | 10/2016 | Gai | H01L 27/1255 |
| 2016/0359054 A1* | 12/2016 | Fang | H01L 29/78633 |
| 2017/0047386 A1* | 2/2017 | Lee | G01R 31/3177 |
| 2018/0226463 A1* | 8/2018 | Hsin | H01L 27/124 |
| 2018/0226597 A1* | 8/2018 | Byun | H01L 25/0753 |
| 2018/0331320 A1* | 11/2018 | Su | H01L 27/3246 |
| 2019/0058012 A1* | 2/2019 | Song | H01L 27/3279 |
| 2019/0058165 A1* | 2/2019 | Xu | H01L 51/0021 |
| 2019/0067405 A1* | 2/2019 | Wang | H01L 51/5228 |
| 2019/0088732 A1* | 3/2019 | Jung | H01L 27/124 |
| 2019/0115546 A1* | 4/2019 | Lu | H01L 27/3253 |
| 2019/0115561 A1* | 4/2019 | Tang | H01L 27/124 |
| 2019/0148661 A1* | 5/2019 | Byun | H01L 51/56 |
| | | | 257/13 |
| 2019/0181372 A1* | 6/2019 | Nam | H01L 51/5012 |
| 2019/0319081 A1* | 10/2019 | Kim | H01L 51/5253 |
| 2019/0341277 A1* | 11/2019 | Yoo | H01J 37/32449 |
| 2020/0208822 A1* | 7/2020 | Lee | H01L 51/5253 |
| 2020/0295104 A1* | 9/2020 | Kim | H01L 27/322 |

\* cited by examiner

SIGNAL CONTROL UNIT FOR AN ORGANIC LIGHT EMITTING DIODE DISPLAY DEVICE, METHOD OF MANUFACTURING THE SAME, AND ORGANIC LIGHT EMITTING DIODE DISPLAY DEVICE INCLUDING THE SAME

CROSS-REFERENCE TO RELATED APPLICATION

This application claims priority to Korean Patent Application No. 10-2018-0044552, filed on Apr. 17, 2019 and all the benefits accruing therefrom under 35 U.S.C. § 119, the contents of which are incorporated by reference in their entirety.

TECHNICAL FIELD

The present disclosure relates to a signal control unit for an organic light emitting diode (OLED) display device, a method of manufacturing the same, and an OLED display device including the same. More particularly, the present disclosure relates to a signal control unit for an OLED display device capable of controlling signals for displaying images using a light emitting phenomenon of organic material, a method of manufacturing the signal control unit for an OLED display device and an OLED display device including the signal control unit.

BACKGROUND

Generally, an OLED display device may include a signal control unit for controlling a signal for each pixel, a light emitting unit for generating light using an organic material in response to the signal, and a protection unit formed on the light emitting unit to protect the unit as a whole.

The signal control unit may include a substrate structure, lower metal patterns electrically connected to a portion of active elements included in the substrate structure, an insulating interlayer covering the substrate structure and the lower metal patterns, via contacts penetrating from the insulating interlayer to be electrically connected to the lower metal patterns, metal electrodes disposed on the insulating interlayer to be electrically connected to the via contacts, and an electrode passivation layer pattern disposed between the metal electrodes to protect side portions of the metal electrodes.

In detail, after forming an electrode passivaiton layer on the metal electrodes and the insulating interlayer, a planarization process is performing against the electrode passivation layer to expose upper surfaces of the metal electrodes. Therefore, the electrode passivation layer pattern is formed.

However, the upper surfaces of the metal electrodes may be damaged while carrying out the planarization process. Therefore, optical characteristics of the OLED display device may be degraded. In addition, dishing phenomena may occur in the electrode passivation layer pattern due to the planarization process. Further, the side portions of the metal electrodes may be exposed due to the dishing phenomena. Therefore, current leak may occur through the side portions of the metal electrodes.

On the other hand, dishing phenomena may occur to the via contacts while performing the planarization process after the via contacts are formed. A step portion may be undesirably formed to the metal electrodes due to dishing phenomena which occurs to the via contacts. In particular, since the via contacts are located at each central portion of the metal electrodes, the step portion may occur to the central portion of each of the metal electrodes. Therefore, the reflectivity of the metal electrodes reflecting the light generated in the light emitting unit may be reduced, so that the optical characteristics of the OLED display device may be further reduced.

SUMMARY

The example embodiments described herein provide a signal control unit for an OLED display device capable of suppressing damage to the metal electrodes present in conventional device, as well as a loss of reflectivity and a leakage current which flows along a side portion of the metal electrodes as described in the Background.

The example embodiments of the present invention provide a method of manufacturing the signal control unit for an OLED display device.

The example embodiments of the present invention provide an OLED display device including the signal control unit capable of suppressing a damage of metal electrodes, a loss of reflectivity and a leakage current which flows along a side portion f the metal electrodes.

According to an example embodiment of the present invention, a signal control unit for an OLED display device, includes a substrate structure including a plurality of active elements for pixels, a lower metal pattern disposed on the substrate structure, and being configured to be electrically connected to a portion of at least one of the active elements, an insulating interlayer disposed on the substrate structure to cover the lower metal pattern, a via contacts penetrating through the insulating interlayer to be connected to the lower metal pattern, respectively, a metal electrode disposed on the insulating interlayer, and being configured to be connected to the via contact, and an electrode passivation layer pattern covering a peripheral portion of an upper surface and the side surface of the metal electrode to expose a center portion of the upper surface of the metal electrode such that leakage current which flows through the side surface of the metal electrode is suppressed.

In an example embodiment, the electrode passivation layer pattern includes a first passivation film pattern covering the peripheral portions of the upper surfaces and the side surfaces of the metal electrodes, and a second passivation film pattern disposed on the first passivation film pattern.

In an example embodiment, the via contact may be connected to a peripheral portion of a lower surface of the metal electrode such that the metal electrode includes a step portion at the peripheral portion thereof due to dishing phenomena caused by the via contacts.

Here, the electrode passivation layer pattern may cover the step portion to suppress the peripheral portion of the metal electrodes from being exposed.

According to an example embodiment of the present invention, a method of making a signal control unit for an OLED display device includes preparing a substrate structure including a plurality of active elements for pixels, forming a lower metal pattern on the substrate structure, the lower metal pattern being adapted to be electrically connected to at least one of the active elements, forming an insulating interlayer on the substrate structure to cover the lower metal pattern, forming a via contact penetrating through the insulating interlayer, the via contact being connected to the lower metal pattern, and forming a metal electrode on the insulating interlayer to be connected to the via contact, forming an electrode passivation layer pattern covering a peripheral portion of an upper surface and a side surface of the metal electrodes to expose a center portion of the upper surface of the metal electrode such that leakage current which flows through the side surface of the metal electrodes is suppressed.

In an example embodiment, the via contact may be connected to a peripheral portion of a lower surface of the metal electrode such that the metal electrode includes a step portion at the peripheral portions thereof, which may occur due to dishing phenomena caused by the via contacts.

Here, the electrode passivation layer pattern may be formed to cover the step portion to suppress the peripheral portions of the metal electrodes from being exposed.

In an example embodiment, forming the electrode passivation layer pattern may include forming an electrode passivation layer along a profile defined by the insulating interlayer and the metal electrode, and performing a dry etch process against the electrode passivaiton layer using an etch selectivity between the electrode passivation layer and the metal electrode to pattern the electrode passivation layer.

Here, the electrode passivation layer may be formed using a material of one of oxide or nitride.

In an example embodiment, forming the electrode passivation layer pattern may include forming a first electrode passivation film along a profile defined by the insulating interlayer and the metal electrode, forming a second electrode passivation film along a profile defined by the first electrode passivation film, patterning the second electrode passivation film to form a second electrode passivation film pattern exposing a portion of the first electrode passivation film corresponding to the metal electrode, and patterning the first electrode passivation film using the second electrode passivation film pattern as an etch mask to form a first electrode passivation film pattern exposing the upper surface of the metal electrodes.

Here, the first electrode passivation film may be formed using a material of one of oxide or nitride, and the second electrode passivation film is formed using a material of the other of oxide or nitride.

According to an example embodiment of the present invention, an OLED display device may include a signal control unit including a substrate structure including a plurality of active elements for pixels, a lower metal pattern disposed on the substrate structure, and being configured to be electrically connected to a portion of at least one of the active elements, an insulating interlayer disposed on the substrate structure to cover the lower metal pattern, a via contact penetrating through the insulating interlayer to be connected to the lower metal pattern, a metal electrode disposed on the insulating interlayer, and being configured to be connected to the via contact and an electrode passivation layer pattern covering a peripheral portion of an upper surface and the side surface of the metal electrode to expose a center portion of the upper surface of the metal electrode such that leakage current which flows through the side surface of the metal electrode is suppressed, an organic light emitting unit disposed over the signal control unit, the organic light emitting unit including a plurality of light emitting regions for each of pixels, and a protection unit entirely covering the organic light emitting unit, the protection unit including a color filter layer.

According to example embodiments of the present invention, the signal control unit includes the electrode passivation layer pattern covering the upper faces and side surfaces of the metal electrodes, which is formed through a dry etching process instead of a planarization process. Therefore, the upper surfaces of the metal electrodes may be suppressed from being damaged. In addition, since the electrode passivation layer pattern covers the side surfaces of the metal electrodes, leakage of current through the side surfaces of the metal electrodes can be prevented.

Since the via contacts of the signal control unit according to example embodiment of the present invention are connected to the peripheral portions of the lower surfaces of the metal electrodes, the step portions of the metal electrodes, which are generated due to the dishing of the via contacts, may be formed at the peripheral portions of the metal electrodes. Therefore, an effect of the step portions of the metal electrodes may be minimized.

In addition, the electrode passivation layer pattern may cover the step portions formed on the peripheral portions of the upper surfaces of the metal electrodes. Therefore, a decrease in reflectivity of the metal electrodes can be prevented.

Therefore, deterioration in optical characteristics of the organic light emitting diode display device including the signal control unit may be prevented.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
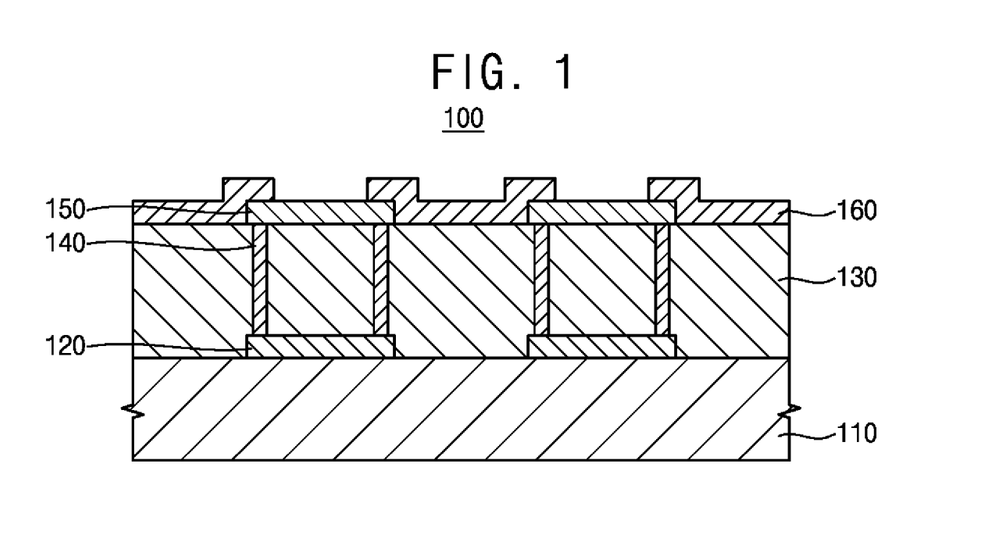
FIG. 1 is a cross sectional view illustrating a signal control unit for an OLED display device in accordance with an example embodiment of the present invention.
Figure 2:
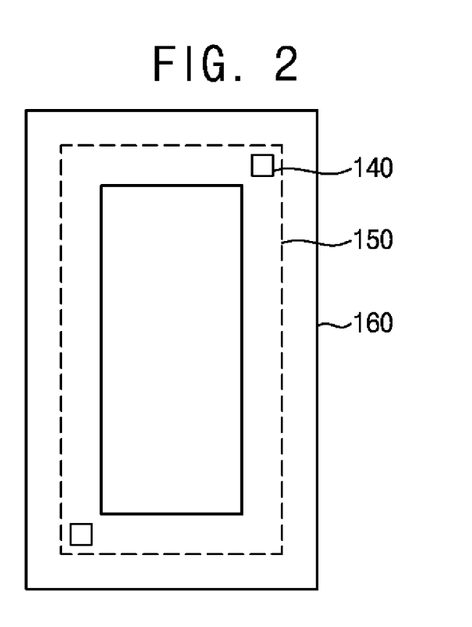
FIG. 2 is a plan view illustrating a positional relation between via contacts, metal electrodes and an electrode passivation layer pattern.

FIG. 1 is a cross sectional view illustrating a signal control unit for an OLED display device in accordance with an example embodiment. FIG. 2 is a plan view illustrating a positional relationship between via contacts, metal electrodes and an electrode passivation layer pattern.

Referring to FIGS. 1 and 2, a signal control unit 100 for an OLED display device in accordance with an example embodiment of the present invention includes a substrate structure 110, lower metal patterns 120, an insulating interlayer 130, via contacts 140, metal electrodes 150 and an electrode passivation layer pattern 160.

The signal control unit 100 may control signals for driving each of a plurality of pixels included in an OLED display device. Further, the signal control unit 100 may control a path of light which is generated by a light emitting unit (not shown) positioned over the signal control unit 100.

The substrate structure 110 may control electric signals to be applied to each of the pixels of the light emitting unit. That is, the substrate structure 110 may includes a substrate (not shown) and active elements (not shown) corresponding to each of pixels.

The substrate, for example, includes a glass substrate or a polyimide substrate having a flexible characteristic.

The active elements include, for example, a plurality of diodes or transistors. Further, each of the active elements may include an erasable programmable read only memory (EPROM) capable of erasing data by irradiating ultraviolet light, and an electrically erasable programmable read only memory (EEPROM) capable of erasing data using electricity instead of ultraviolet light. Each of the active elements may control a signal using a floating gate where electrical charges are charged or erased so that the data can be removed.

The active elements may control the light emitting unit by applying an electrical signal to the light emitting unit via the lower metal patterns 120, the via contacts 140, and the metal electrodes 150.

The lower metal patterns 120 are disposed on the substrate structure 110. Each of the lower metal patterns 120 may be connected to one of the active elements. When the active elements include transistors, each of the lower metal patterns 120 may be connected to a source or drain terminal of a corresponding transistor.

The lower metal patterns 120 may be made of copper, aluminum, tungsten, or an alloy thereof, for example.

The insulating interlayer 130 is disposed on the substrate structure 110 to cover the lower metal patterns 120. The insulating interlayer 130 may include oxide or nitride. Further, the insulating interlayer 130 may have a stack structure including an oxide layer and a nitride layer which are sequentially stacked on the substrate structure 110.

The via contacts 140 penetrates through the insulating interlayer 130 to be connected to upper surfaces of the lower metal patterns 120. Each of the via contacts 140 extends in a vertical direction. The via contacts 140 may include copper, aluminum, tungsten, or an alloy thereof, for example.

The via contacts 140 are provided in the insulating interlayer 130. Therefore, the via contacts 140 may electrically connect the lower metal patterns 120 and the metal electrodes 150 with one another.

The metal electrodes 150 are disposed on the insulating interlayer 130. Each of the metal electrodes 150 is connected to each of the via contacts 140. Each of the metal electrodes 150 corresponds to each of the lower metal patterns 120. Each of the lower metal patterns 120 and the metal electrodes 150 may be electrically connected to each other through each of the via contacts 140.

When the active elements include transistor, each of the lower metal patterns 120 is connected to a source/drain terminal of the transistor so that each of the metal electrodes 150 may function as an anode electrode.

The metal electrodes 150 may be formed of metal material identical to that of the lower metal patterns 120. That is, the metal electrodes 150 may be made of copper, aluminum, tungsten, or an alloy thereof, for example.

While forming the via contacts 140, dishing phenomena in which the upper surfaces of the via contacts 140 are concave in the process of planarizing the upper surfaces of the via contacts 140 may occur. A step portion may be formed in the metal electrodes 150 due to dishing of the via contacts 140.

The via contacts 140 may be provided in at least one capable of connecting one of the lower electrodes 120 with one of the corresponding metal electrodes 150. In this case, each of the via contacts 140 may connect a peripheral portion of an upper surface of each of the lower metals 120 with a peripheral portion of a lower surface of each of the metal electrode 150, respectively.

While performing a process for forming the via contacts 140, a planarization process may be required to planarize the upper surfaces of the via contacts, which may cause dishing phenomena to occur to make the upper surfaces of the via contacts to be concave. Therefore, the metal electrodes 150 disposed on the via contacts may include a step portion thereon.

Since the via contacts 140 are connected to the peripheral portions of the lower surfaces of the metal electrodes 150, the step portions of the metal electrodes 150, which may be generated due to the dishing phenomena which occur to the via contacts 140, may be formed at a peripheral portion thereof, instead at a central portion thereof. Therefore, an influence of the step portions of the metal electrodes 150 may be decreased.

The electrode passivation layer pattern 160 is disposed on the metal electrodes 150 and the insulating interlayer 130 to expose center portions of the upper surfaces of the metal electrodes 150. Therefore, the electrode passivation layer pattern 160 covers peripheral portions and side surfaces of the metal electrodes 150.

The electrode passivation layer pattern 160 may include the material identical as that of the insulating interlayer 130. Alternatively, the electrode passivaiton layer pattern 160 may be formed of a material different from that of the insulating interlayer 130. For example, the electrode passivation film pattern 160 may include oxide or nitride The electrode passivation layer pattern 160 may be formed by a dry etching process, rather than a planarization process, in embodiments. Therefore, since the planarization process is not performed, the upper surface of the metal electrodes 150 can be prevented from being damaged, dished, or stepped in shape.

In addition, since the electrode passivation layer pattern 160 covers the side surfaces of the metal electrodes 150, leakage of current through the side surfaces of the metal electrodes 150 may be suppressed.

The electrode passivation layer pattern 160 may cover the step portions formed on the peripheral portions of the upper surface of the metal electrodes 150. Therefore, the reflectivity of the metal electrodes 150 may be suppressed from being lowered due to the step portions. In addition, deterioration in optical characteristics of the OLED display device including the signal control unit 100 may be prevented.

Figure 3:
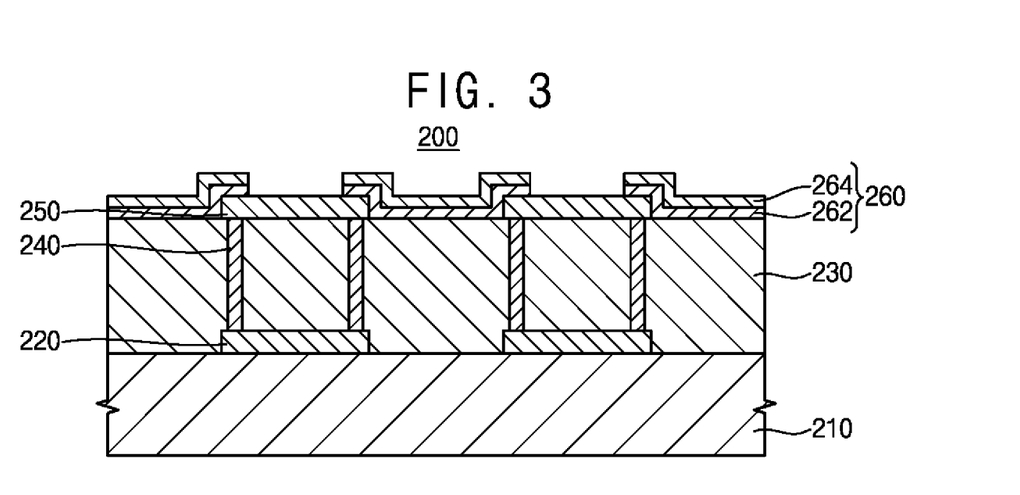
FIG. 3 is a cross sectional view illustrating a signal control unit for an OLED device in accordance with an example embodiment of the present invention.

FIG. 3 is a cross sectional view illustrating a signal control unit for an OLED device in accordance with an embodiment of the present invention.

Referring to FIG. 3, a signal control unit 200 for an OLED display includes a substrate structure 210, lower metal layers 220, an insulating interlayer 230, via contacts 240, metal electrodes 250, and an electrode passivation layer pattern 260. Since the substrate structure 210, the lower metal layers 220, the insulating interlayer 230, the via contacts 240, and the metal electrodes 250 are substantially identical to their counterparts (substrate structure 110, lower metal layers 120, the insulating interlayer 130, the via contacts 140, and the metal electrodes 150) described with respect to FIGS. 1 and 2, detailed description will be omitted in order to avoid any redundancy.

The electrode passivation layer pattern 260 includes a first passivation film pattern 262 and a second passivation film pattern 264.

The first passivation film pattern 262 is disposed on the metal electrodes 250 and the insulating interlayer 230 while exposing a center portion of the top surface of the metal electrodes 250. Accordingly, the first passivation film pattern 262 covers peripheral portions and side surfaces of the metal electrodes 250.

The second passivation film pattern 264 is disposed on the first passivation film pattern 262. The second passivation film pattern 264 may be used as an etch mask pattern in an etch process for forming the first passivation film pattern 262.

Although not shown, the first passivation film pattern 262 and the second passivation film pattern 264 may be formed to entirely expose the top surfaces of the metal electrodes 250.

The first passivation film pattern 262 may be formed of materials different from that of the second passivation film pattern 264. For example, the first passivation film pattern 262 may be formed of one of oxide and nitride, and the second passivation film pattern 264 may be the other.

The electrode passivation layer pattern 260 may be formed by a dry etching process, rather than a planarization process. Therefore, since the planarization process is not performed, the upper surfaces of the metal electrodes 150 may be prevented from being damaged.

Also, since the first passivation film pattern 262 covers the side surfaces of the metal electrodes 250, leakage current which flows through the side surfaces of the metal electrodes 250 may be prevented.

The first passivation film pattern 262 and the second passivation film pattern 264 may continuously cover the step portions which are positioned at peripheral portions of upper surfaces of the metal electrodes 250. Therefore, a decrease of the reflectivity of the metal electrodes 250, which occurs due to the step portions, may be prevented. In addition, deterioration in optical characteristics of the OLED display device including the signal control unit 200 may be prevented.

Figure 4:
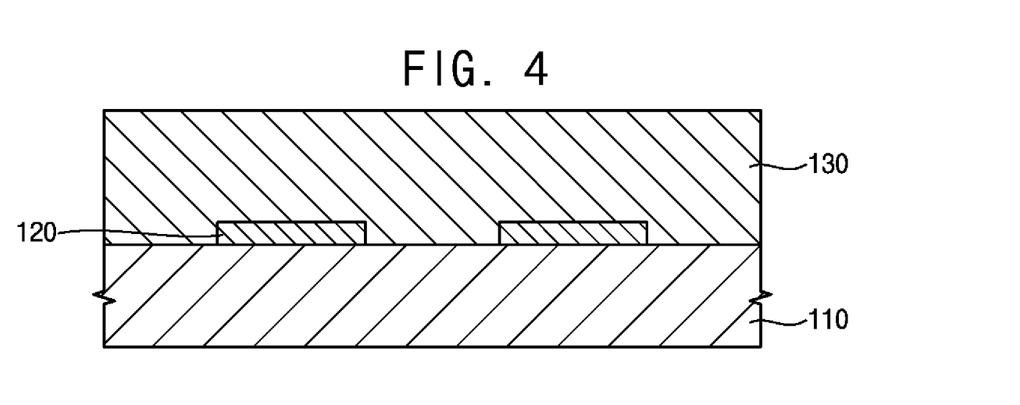
FIGS. 4 to 6 are cross sectional views illustrating a method of manufacturing a signal control unit of an OLED display device in accordance with an example embodiment of the present invention.
Figure 5:
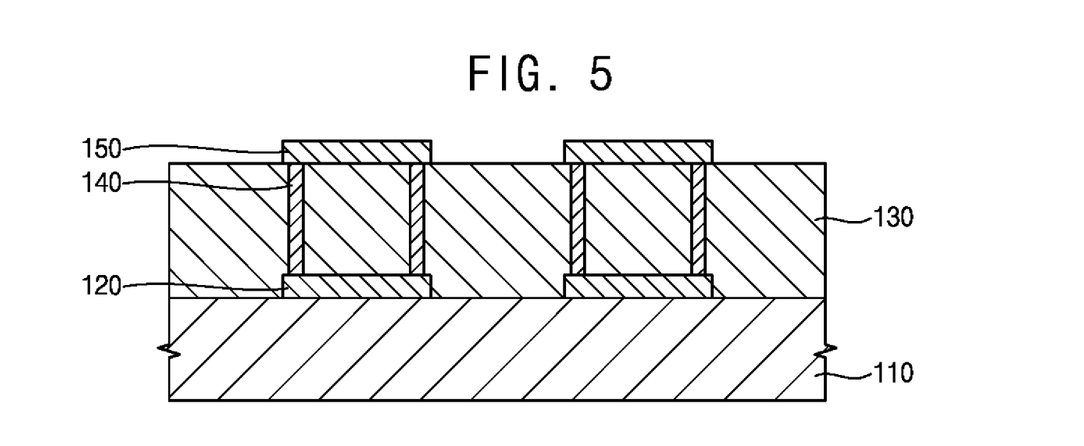
Figure 6:
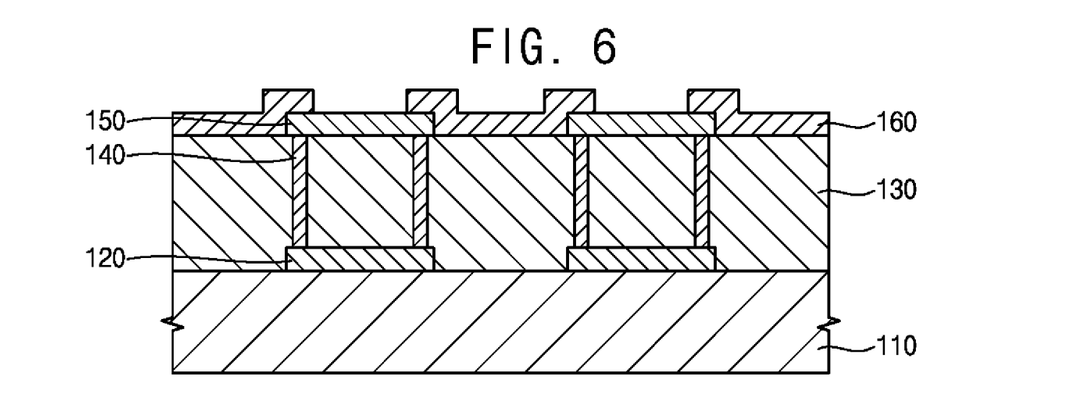

FIGS. 4 to 6 are cross sectional views illustrating a method of manufacturing a signal control unit of an OLED display device in accordance with an example embodiment of the present invention.

Referring to FIG. 4, according to an example embodiment of a method of manufacturing a signal control unit for an OLED display device, a substrate structure 110 including active elements for each pixel is prepared.

The substrate structure 110 may be prepared by forming active elements (not shown) formed on the substrate for each pixel.

The active elements are formed to include, for example, a diode or a transistor. Further, the active elements may include an erasable programmable read only memory (EPROM) capable of erasing data by irradiating ultraviolet light, or an electrically erasable programmable read only memory (EEPROM) capable of erasing data using electricity instead of ultraviolet light. The active elements may control a signal using a floating gate. Electric charges are charged or erased in the floating gate, so that data may be removed.

Subsequently, lower metal patterns 120 are formed on the substrate structure 110 to be electrically connected to the active elements partially.

In order to form the lower metal patterns 120, a first metal layer (not shown) is firstly formed on the substrate structure 110. The first metal layer may be formed through a sputtering process or a chemical vapor deposition process. Then, the first metal layer is patterned to transform the first metal layer into the lower metal patterns 120. In order to pattern the first metal layer, an etching process may be performed.

An insulating interlayer 130 is formed on the substrate structure 110 to cover the lower metal patterns 120. The insulating interlayer 130 may be formed through a plasma enhanced chemical vapor deposition process. The insulating interlayer 130 may be formed using oxide or nitride. The insulating interlayer 130 may be formed in a single layer or a multiple layers.

Referring to FIG. 5, via contacts 140 are formed to penetrate through the insulating interlayer 130. Therefore, the via contacts 140 extend in a vertical direction to be connected with the lower metal patterns 120. The insulating interlayer 130 is partially etched to form via holes to expose an upper surface of each of the lower metal patterns 120. Then, the via holes are filled with a metal material to form via contacts 140.

Next, metal electrodes 150 are formed on the insulating interlayer 130 to be electrically connected to the lower metal patterns 120 through the via contacts 140. The metal electrodes 150 may be made of metal material the same as that of the lower metals 120. That is, the metal electrodes 150 may be made of copper, aluminum, tungsten, or an alloy thereof.

In order to form the metal electrodes 150, a second metal layer (not shown) is formed on the insulating interlayer 130. The second metal layer may be formed through a sputtering process or a chemical vapor deposition process. Then, the second metal layer is patterned to transform the second metal layer into the metal electrodes 150. In order to pattern the second metal layer, an etching process may be performed.

Each of the metal electrodes 150 may be formed to correspond to each of the lower metal patterns 120. Each of the metal electrodes 150 may be electrically connected to each of the lower metal patterns 120 through the via contacts 140.

Meanwhile, the via contacts 140 may be provided in at least one capable of connecting one of the lower electrodes 120 with one of the corresponding metal electrodes 150. In this case, each of the via contacts 140 may connect a peripheral portion of an upper surface of each of the lower metal 120 with a peripheral portion of a lower surface of each of the metal electrode 150, respectively.

While performing a process for forming the via contacts 140, a planarization process may be required to planarize the upper surfaces of the via contacts, which may cause dishing phenomena to occur to make the upper surfaces of the via contacts to be concave. Therefore, one of the metal electrodes 150 disposed on the via contacts may have a step portion.

Since the via contacts 140 are connected to the peripheral portions of the lower surfaces of the metal electrodes 150, the step portions of the metal electrodes 150, which may occur due to the dishing phenomena which occurs to the via contacts 140, may be formed at a peripheral portion thereof, not at a central portion thereof. Therefore, an influence of the step portions of the metal electrodes 150 may be decreased.

Referring to FIG. 6, an electrode passivation layer pattern 160 is formed on the metal electrodes 150 and the insulating interlayer 130 to expose center portions of the upper surfaces of the metal electrodes 150.

In order to form the electrode passivation layer pattern 160, an electrode passivaiton layer (not shown) is formed on the insulating interlayer 130 so as to cover the metal electrodes 150. The electrode passivation layer may be formed through a plasma enhanced chemical vapor deposition process.

The electrode passivation layer may be formed using a material identical as that of the insulating interlayer 130. Alternatively, the electrode passivation layer may be formed of a material different from that of the insulating interlayer 130. For example, the electrode passivation layer can include oxide or nitride Then, the electrode passivation layer is patterned to form the electrode passivation layer pattern 160. In order to pattern the electrode passivation layer, a dry etching process may be performed.

The electrode passivation layer pattern 160 exposes the center portions of the upper surfaces of the metal electrodes 150 and covers the peripheral portions and side surfaces of the metal electrodes 150.

Meanwhile, although not shown, the electrode passivation layer pattern 160 may entirely expose the upper surface of the metal electrodes 150.

The electrode passivation layer pattern 160 may be formed by a dry etching process, not a planarization process. Therefore, since the planarization process is not performed, the upper surface of the metal electrodes 150 can be prevented from being damaged.

In addition, since the electrode passivation layer pattern 160 covers the side surfaces of the metal electrodes 150, leakage of current through the side surfaces of the metal electrodes 150 may be suppressed.

The electrode passivation layer pattern 160 may cover the step portions formed on the peripheral portions of the upper surface of the metal electrodes 150. Therefore, the reflectivity of the metal electrodes 150 may be suppressed from being lowered due to the step portions. In addition, deterioration in optical characteristics of the organic light emitting diode (OLED) display device including the signal control unit 100 may be prevented.

Figure 7:
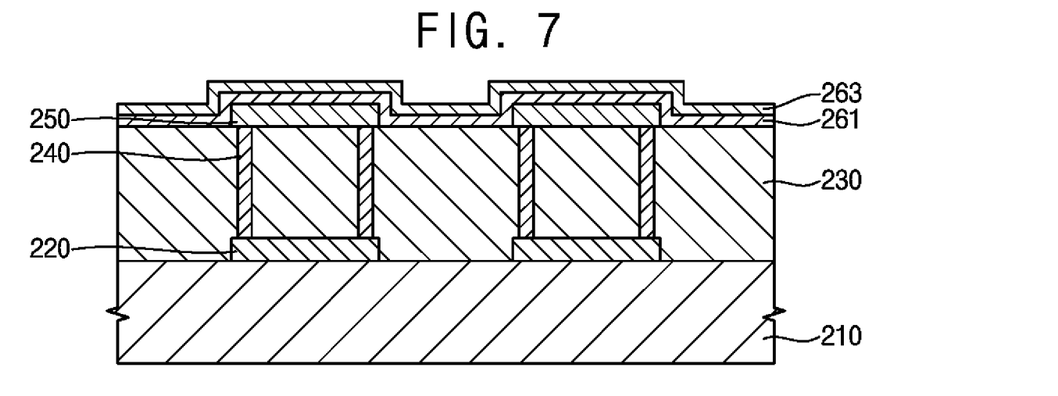
FIGS. 7 and 8 are cross sectional views illustrating a method of manufacturing a signal control unit of an OLED display device in accordance with an example embodiment of the present invention.
Figure 8:
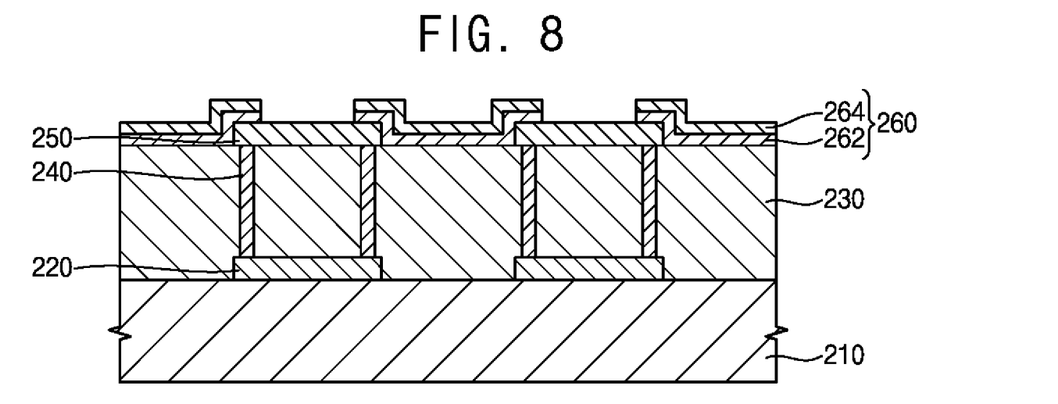

FIGS. 7 and 8 are cross sectional views illustrating a method of manufacturing a signal control unit of an OLED display device in accordance with an example embodiment of the present invention.

Referring to FIG. 7, since the processes for forming a substrate structure 210, lower metal patterns 220, an insulating interlayer 230, the via contacts 240, and the metal electrodes 250 are substantially identical to those for forming the lower metal layers 120, the insulating interlayer 130, the via contacts 140, and the metal electrodes 150 illustrated with respect to FIGS. 4 and 6, detailed description will be omitted in order to avoid any redundancy.

An electrode passivation layer pattern 260 (see FIG. 8) is formed on the metal electrodes 250 and the insulating interlayer 230 to expose the center portions of the upper surfaces of the metal electrodes 250.

A first passivation film 261 and a second passivation film 263 are sequentially formed on the insulating interlayer 230 to cover the metal electrodes 250 in order to form the electrode passivation layer pattern 260. The first passivation film 261 and the second passivation film 263 may be formed through a plasma enhanced chemical vapor deposition process.

The first passivation film 261 and the second passivation film 263 may be formed of different materials. For example, the first passivation film 261 may be formed of one of oxide and nitride, and the second passivation film 263 may be formed of the other.

Referring to FIG. 8, the first passivation film 261 and the second passivation film 263 are dry-etched to form the electrode passivation layer pattern 260 including the first passivation film pattern 262 and the second passivation film pattern 264.

Specifically, the second passivation film 263 is patterned to form the second passivation film pattern 264 having portions of the second passivation film pattern 264 corresponding to the center portions of the upper surfaces of the metal electrodes 250 open. In order to pattern the second passivation film 263, a dry etching process may be performed.

Next, the first passivation film 261 is patterned to form the first passivation film pattern 262. The first passivation film 261 is patterned through a dry etching process using the second passivation film pattern 264 as an etching mask.

The first passivation film pattern 262 covers the peripheral portion of the upper surfaces and the side surfaces of the metal electrodes 250, while exposing the center portions of the upper surfaces of the metal electrodes 250.

Although not shown, the first passivation film pattern 262 and the second passivation film pattern 264 may be formed to entirely expose the upper surfaces of the metal electrodes 250.

Since the electrode passivation layer pattern 260 is formed by a dry etching process instead of a planarization process, the upper surfaces of the metal electrodes 250 may be suppressed from being damaged.

Also, since the first passivation film pattern 262 covers the side surfaces of the metal electrodes 250, leakage of current which may flows through the side surfaces of the metal electrodes 250 may be prevented.

The first passivation film pattern 262 and the second passivation film pattern 264 may continuously cover the step portions formed on the peripheral portions of the upper surfaces of the metal electrodes 250. Therefore, a decrease of the reflectivity of the metal electrodes 250, which may occur due to the step portions, may be prevented. In addition, deterioration in optical characteristics of the organic light emitting diode display device of the signal control unit 200 may be prevented.

Figure 9:
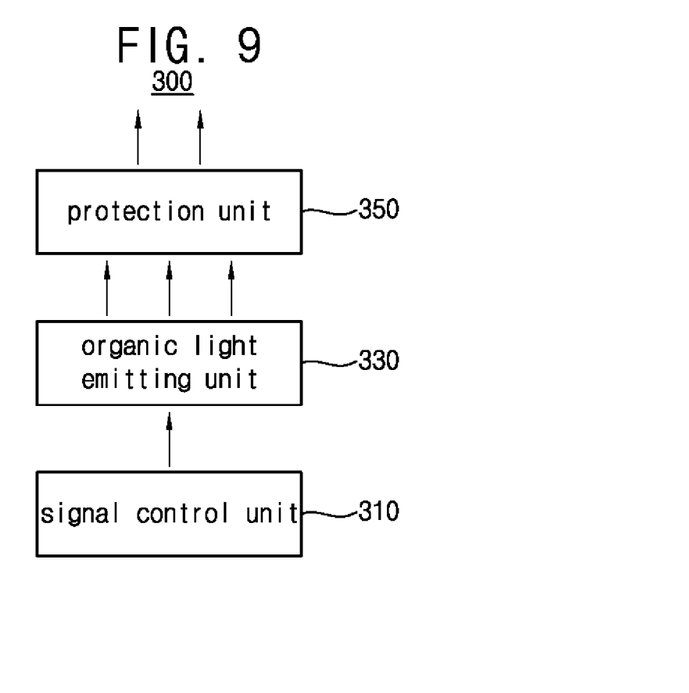
FIG. 9 is a block diagram illustrating an OLED display device in accordance with an example embodiment of the present invention.
Figure 10:
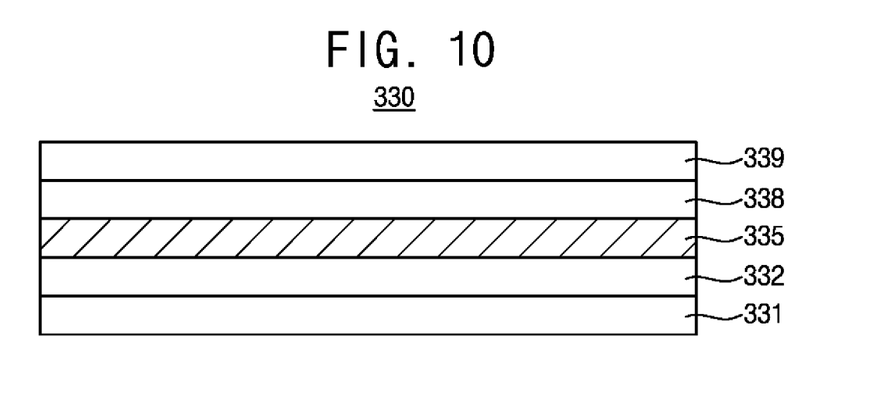
FIG. 10 is a cross sectional view illustrating the OLED display device shown in FIG. 9.

FIG. 9 is a block diagram illustrating an OLED display device in accordance with an example embodiment of the present invention. FIG. 10 is a cross sectional view illustrating the OLED device shown in FIG. 9.

Referring to FIGS. 9 and 10, an OLED device 300 according to an example embodiment of the present invention includes a signal control unit 310, an organic light emitting unit 330, and a protection unit 350.

Since the signal control unit 310 has been described above with reference to FIGS. 1 and 2, a detailed description on the signal control unit 310 will be omitted.

The organic light emitting unit 330 is provided on the signal control unit 310. The organic light emitting unit 330 is driven by a signal generated from the signal control unit 310.

The organic light emitting unit 330 includes an anode electrode 331, a hole transport layer 332, a light emitting layer 335, an electron transport layer 338 and a cathode electrode 339.

Holes injected into the anode electrode 331 move to an emission layer 335 through a hole transfer layer 332. Electrons injected from the cathode 339 are transferred to the light emitting layer 335 through an electron transfer layer 338. The holes/electrons collected to the light emitting layer 335 are recombined to emit light.

One portion of the light emitted as described above is emitted to the outside through a color filter layer included in the passivation unit 350, thereby realizing an image. Meanwhile, another portion of the light is directed to the substrate structure 310 and is irradiated downward.

Since the electrode passivation layer pattern covers the step portions formed on the peripheral portions of the upper surfaces of the metal electrodes to prevent the reflectivity of the metal electrodes from lowering, and the light may be stably reflected from the metal electrodes. Therefore, the optical characteristics of the OLED display device may be improved.

In addition, since the electrode passivation layer pattern covers the side surfaces of the metal electrodes, leakage of current which flows through the side surfaces of the metal electrodes may be prevented. Therefore, the reliability of the OLED display device may be enhanced.

As described above, the signal control unit according to example embodiments of the present invention may prevent current from leaking through the side surfaces of the metal electrodes, may minimize the influence due to the step portions of the metal electrode so as to reduce the reflectivity of the metal electrodes. Therefore, deterioration in optical characteristics of the OLED display device including the signal control unit may be prevented.

Although the signal control unit and the OLED device have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

We claim:

1. A signal control unit for an organic light emitting diode (OLED) display device comprising:
   a substrate structure including a plurality of active elements each corresponding to a pixel;
   a lower metal pattern disposed on the substrate structure, and electrically connected to a portion of the plurality of active elements;
   an insulating interlayer disposed on the substrate structure and at least partially covering the lower metal pattern;
   a via contact penetrating through the insulating interlayer and connected to the lower metal pattern;
   a metal electrode disposed on the insulating interlayer, and connected to the via contact; and
   an electrode passivation layer pattern substantially covering the metal electrode to expose a center portion of an upper surface of the metal electrode while covering a remainder of the upper surface and a side surface of the metal electrode.

2. The signal control unit of claim 1, wherein the electrode passivation layer pattern comprises:
   a first passivation film pattern arranged on the remainder of the upper surface and the side surface of the metal electrode; and
   a second passivation film pattern disposed on the first passivation film pattern.

3. The signal control unit of claim 1, wherein the via contact is connected to a peripheral portion of a lower surface of the metal electrode such that the metal electrode includes a step portion at the peripheral portion thereof corresponding to a dishing phenomena caused by formation of the via contacts.

4. The signal control unit of claim 3, wherein the electrode passivation layer pattern covers the step portion to suppress the peripheral portion of the metal electrodes from being exposed.

5. A method of manufacturing a signal control unit for an organic light emitting diode (OLED) display device, the method comprising:
   preparing a substrate structure including a plurality of active elements each corresponding to a pixel;
   forming a lower metal pattern on the substrate structure, the lower metal pattern being adapted to be electrically connected to at least one of the plurality of active elements;
   forming an insulating interlayer on the substrate structure to cover the lower metal pattern;
   forming a via contact penetrating through the insulating interlayer, the via contact being connected to the lower metal pattern; and
   forming a metal electrode on the insulating interlayer and connected to the via contact;
   forming an electrode passivation layer pattern covering a peripheral portion of an upper surface and a side surface of the metal electrodes to expose a center portion of the upper surface of the metal electrode such that leakage current which flows through the side surface of the metal electrodes is suppressed.

6. The method of claim 5, wherein the via contact is connected to a peripheral portion of a lower surface of the metal electrode such that the metal electrode includes a step portion at the peripheral portions thereof, which may occur due to dishing phenomena caused by the via contacts.

7. The method of claim 6, wherein the electrode passivation layer pattern is formed to cover the step portion to suppress the peripheral portions of the metal electrodes from being exposed.

8. The method of claim 5, wherein forming the electrode passivation layer pattern comprises:
   forming an electrode passivation layer along a profile defined by the insulating interlayer and the metal electrode; and
   performing a dry etch process against the electrode passivaiton layer using an etch selectivity between the electrode passivation layer and the metal electrode to pattern the electrode passivation layer.

9. The method of claim 8, wherein the electrode passivation layer is formed using a material of one of oxide or nitride.

10. The method of claim 5, wherein forming the electrode passivation layer pattern comprises:
    forming a first electrode passivation film along a profile defined by the insulating interlayer and the metal electrode;
    forming a second electrode passivation film along a profile defined by the first electrode passivation film;
    patterning the second electrode passivation film to form a second electrode passivation film pattern by exposing a portion of the first electrode passivation film corresponding to the metal electrode; and
    patterning the first electrode passivation film using the second electrode passivation film pattern as an etch mask to form a first electrode passivation film pattern and exposing the upper surface of the metal electrodes.

11. The method of claim 10, wherein the first electrode passivation film is formed using a material selected from a group consisting of oxide and nitride, and the second electrode passivation film is formed using the other of the group consisting of oxide and nitride.

12. An organic light emitting diode (OLED) display device, comprising:
    a signal control unit including a substrate structure including a plurality of active elements for pixels, a lower metal pattern disposed on the substrate structure, and electrically connected to a portion of at least one of the plurality of active elements, an insulating interlayer disposed on the substrate structure to cover the lower metal pattern, a via contact penetrating through the insulating interlayer to be connected to the lower metal pattern, a metal electrode disposed on the insulating interlayer, and connected to the via contact and an electrode passivation layer pattern covering a peripheral portion of an upper surface and the side surface of the metal electrode to expose a center portion of the upper surface of the metal electrode such that leakage current which flows through the side surface of the metal electrode is suppressed;
    an organic light emitting unit disposed over the signal control unit, the organic light emitting unit including a plurality of light emitting regions for each of pixels; and
    a protection unit entirely covering the organic light emitting unit, the protection unit including a color filter layer.

13. The OLED display device of claim 12, wherein the electrode passivation layer pattern comprises:
    a first passivation film pattern arranged on the remainder of the upper surface and the side surface of the metal electrode; and a second passivation film pattern disposed on the first passivation film pattern.

14. The OLED display device of claim 12, wherein the via contact is connected to a peripheral portion of a lower surface of the metal electrode such that the metal electrode includes a step portion at the peripheral portion thereof corresponding to a dishing phenomena caused by formation of the via contacts.

15. The OLED display device of claim 14, wherein the electrode passivation layer pattern covers the step portion to suppress the peripheral portion of the metal electrodes from being exposed.

* * * * *